US005481189A

United States Patent [19]
DiLella et al.

[11] Patent Number: 5,481,189
[45] Date of Patent: Jan. 2, 1996

[54] ELECTRON TUNNELING MAGNETIC FIELD SENSOR WITH CONSTANT TUNNELING CURRENT MAINTAINED BETWEEN TUNNELING TIP AND ROTATABLE MAGNET

[75] Inventors: Daniel DiLella, Lorton; Richard J. Colton, Springfield, both of Va.

[73] Assignee: The United States of America as represented by the Secretary of the Navy, Washington, D.C.

[21] Appl. No.: 193,690

[22] Filed: Feb. 7, 1994

[51] Int. Cl.[6] .................................................. G01R 33/02
[52] U.S. Cl. ........................... 324/259; 324/244; 324/209
[58] Field of Search ..................................... 324/200, 201, 324/205, 209, 226, 225, 244, 260–262, 256, 259; 250/306, 307; 310/366, 321; 73/382 R, 383, 862.625, 178 R; 365/151, 174

[56] References Cited

U.S. PATENT DOCUMENTS

| | | | |
|---|---|---|---|
| 4,987,303 | 1/1991 | Takase et al. | 250/306 |
| 5,103,174 | 4/1992 | Wandass et al. | 324/244 |
| 5,290,102 | 3/1994 | Kaiser et al. | 324/244 X |
| 5,293,781 | 3/1994 | Kaiser et al. | 73/862.625 |
| 5,315,247 | 5/1994 | Kaiser et al. | 324/244 |
| 5,331,589 | 7/1994 | Gambino et al. | 365/151 |
| 5,375,087 | 12/1994 | Moreland et al. | 250/306 X |

Primary Examiner—Sandra L. O'Shea
Assistant Examiner—Jay M. Patidar
Attorney, Agent, or Firm—Thomas E. McDonnell; George A. Kap

[57] ABSTRACT

The magnetic sensor of this invention is characterized by a magnet suspended on a torsion bar or wire and by a tunneling tip separated from one end of the magnet, a gap between the tip and the magnet that is small enough to support a tunneling current, an electrical source for imposing a constant biasing voltage across the gap, an electrical force to maintain the magnet and the tip sufficiently close so that a constant tunneling current is maintained therebetween, a feedback circuit to monitor current changes in the gap that result from rotation of the magnet due to changes in the surrounding magnetic field, and at least one recorder to record changes in the magnetic field. The method for detecting rotation of a magnet by a sensor caused by a change in the surrounding magnetic field includes the steps of biasing tunneling tip and a magnet with respect to each other, positioning the tip and/or magnet so there is a tunneling current therebetween, adjusting width of the tunneling gap to establish a constant tunneling current therebetween, exposing the magnet to a magnetic field that causes the magnet to rotate and to change the width of the gap, adjusting the width of the gap to re-establish a constant tunneling current in the gap, and recording the change in the feedback control voltage which is proportional to the change in the magnetic field.

19 Claims, 5 Drawing Sheets

ELECTRON TUNNELING MAGNETIC FIELD SENSOR WITH CONSTANT TUNNELING CURRENT MAINTAINED BETWEEN TUNNELING TIP AND ROTATABLE MAGNET

FIELD OF THE INVENTION

This invention relates generally to a magnetic field sensor and specifically to an electron tunneling technique to detect rotation of a magnet.

BACKGROUND OF THE INVENTION

Magnetic sensors can be used in many applications including magnetometry, magnetic sensing, magnetic imaging, and magnetic testing. Possible field applications include navigation, magnetic anomaly detection, magnetic compassing, and magnetic mapping.

The invention of the scanning tunneling microscope has stimulated new ideas for nanoscale technology, including new types of sensors that exploit properties of tunneling transducers. A particularly important property that distinguishes tunneling transducers from other transducers is that tunneling transducers have inherent gain. The gain is a consequence of the exponential dependence of the tunneling current on electrode spacing. Because of the gain, the signal from a tunneling transducer is much larger than from a conventional transducer with the result that much less amplification is needed to get a useable signal. Consequently, the noise added in the amplification stage is greatly reduced. Electron tunneling devices also have the advantage that they can be scaled down without losing sensitivity.

The tunneling transducers are characterized by a tip electrode that is spaced from a counter electrode by about 1 nm. The tunneling gap is the space between the tunneling tip and the counter electrode. The counter electrode and the gap configuration constitute a tunneling junction.

For a typical tunneling sensor, the current increases by a factor of ten for each 0.1 nm change in the tunneling gap. In the most common configuration, the tunneling current, or the current in the gap between the tip and the counter electrode, is maintained constant by the use of a feedback control circuit and a displacement actuator that adjusts the width of the gap to maintain the constant current. The feedback control circuit is used to compare the tunnel current to a reference value and to generate an error signal that is proportional to the difference. The error signal is used to control the displacement actuator that, in turn, controls the size of the tunneling gap.

U.S. Pat. No. 5,103,174 discloses the use of scanning tunneling technology in sensing devices for measuring the effect of magnetic field variations on magnetostrictive materials. Magnetostrictive materials are characterized by dimension changes in response to changes in the local magnetic field.

Table 1, below, is a listing of the properties of several magnetic field sensors, including the sensor described herein. The sensitivity listed for the tunneling sensor is based on the noise limit set by Brownian motion of a suspended magnet.

TABLE 1

| Type | Sensitivty (nTesla/√Hz) | Volume (cm$^3$) | Power (mW) |
| --- | --- | --- | --- |
| Squid (at 4 K) | 10$^{-6}$ | 10 | 1000 |
| Fiber Optic | 7 × 10$^{-5}$ | 60 | 500 |
| Optically Pumped | 10$^{-3}$ | 500 | 7500 |
| Tunneling | 10$^{-3}$ | 10 | 1 |
| Proton Precession | 10$^{-2}$ | 500 | 1000 |
| Fluxgate | 3 × 10$^{-2}$ | 50 | 500 |
| Suspended Magnet | 10$^{-1}$ | 200 | 40 |
| Magnetotransistor | 10 | 1 | < 1 |
| Hall Probe | 1000 | 5 | 100 |
| Magnetodiode | 1000 | 1 | < 1 |
| Magnetoresistor | 1000 | 1 | < 1 |

OBJECTS AND SUMMARY OF THE INVENTION

An object of this invention is a very sensitive electron tunneling magnetic field sensor that can operate on low power and at room temperature;

Another object of this invention is an electron tunneling magnetic field sensor that can be micromachined from silicon;

Another object of this invention is an electron tunneling magnetic field sensor that, including electronics, is small enough to fit on a single integrated circuit package;

Another object of this invention is an electron tunneling magnetic field sensor that, due to its small size and low power consumption, can be used in applications that require multiple sensors or sensor arrays;

Another object of this invention is a method for sensing a magnetic field using electron tunneling technology.

These and other objects of this invention are realized by an electron tunneling magnetic field sensor characterized by a suspended magnet that can rotate in response to changes in the local magnetic field, a tunneling tip that is close enough to the magnet so that a measurable tunneling current can be established between the tip and the magnet, a displacement actuator to control the width of the tunneling gap, a feedback control circuit for measuring the tunneling current and for maintaining a constant tunneling current between the tip and the magnet, a voltage source for providing biasing voltage between the magnet and the tip and and a source of power for the feedback control circuit. The method for sensing changes in magnetic field includes the steps of establishing an electrical bias between a tunneling tip and a counter electrode and maintaining the tunneling gap and the tunneling current constant.

DETAILED DESCRIPTION OF THE INVENTION

The electron tunneling magnetic field sensor of this invention is used to detect minute rotations of a magnet that occur when the magnetic field changes in the vicinity of the magnet. The angle through which the magnet rotates depends on the magnetic torque that results from the interaction between the magnetic dipole of the magnet and the local magnetic field. The method for sensing rotation of the magnet is based on the electron tunneling technology and is so sensitive that it can be used to detect displacements on the atomic level.

The active element of one embodiment of the magnetic field sensor of this invention is a small bar magnet that is attached to a torsion wire or bar. The junction between the magnet and wire or bar is made with a conducting epoxy so that the torsion wire or bar can be used to carry the tunnel current. The base to which the wire or bar is attached is a nonconducting ceramic material. A tunneling tip mounted on the end of a piezoelectric tube displacement actuator is used to follow the motion of the magnet. The displacement control voltage is applied across electrodes plated on the inner and outer surfaces of the piezoelectric tube displacement actuator.

As used herein, the term "rotation" generally means movement of the magnet around a fulcrum and includes movement of less than 360°.

In the operation of the magnetic field sensor of this invention, the tunneling tip is positioned close enough to the end of the magnet so that the desired tunnel current is established. A feedback control circuit is used to monitor the tunnel current and to control the position of the tip to maintain constant tunnel current. Since the movement of the tip and/or magnet is directly proportional to the feedback error signal, the rotation of the magnet and, therefore, the change in magnetic field can be detected by monitoring the feedback error signal.

The tunneling tip is typically made from a conductive material or a semiconductor, for example a tungsten wire, a gold wire or a platinum-iridium wire or it can be made of a semiconductor coated with a conducting metal. The tip can be sharpened by using appropriate electrochemical etching techniques for metal wires or by mechanical means. The tip can be attached to a tubular piezoelectric displacement actuator which acts to control the tunneling gap or it can be an integral part of the sensor. The feedback control circuit provides an error voltage that is used to control the magnet or the displacement actuator that positions the tip with respect to the end of the magnet or the magnet with respect to the tip.

The magnet should be made of a non-magnetostrictive material in order to avoid detection of changes in the tunneling current caused by changes in the shape of the magnet. Since changes in magnetic field are to be detected by the magnetic field sensor of this invention, only rotational changes in the magnet due to the changes in the surrounding magnetic field should be detected by the sensor.

It should be apparent to a person skilled in this art that other materials and other parameters can be used without departing from the spirit of this invention. For instance, any suitable magnet can be used differing in material composition and dimensions. In place of a torsion bar or a torsion wire with circular cross-section, a thin wire or bar of any cross-section can be used.

Figure 1:
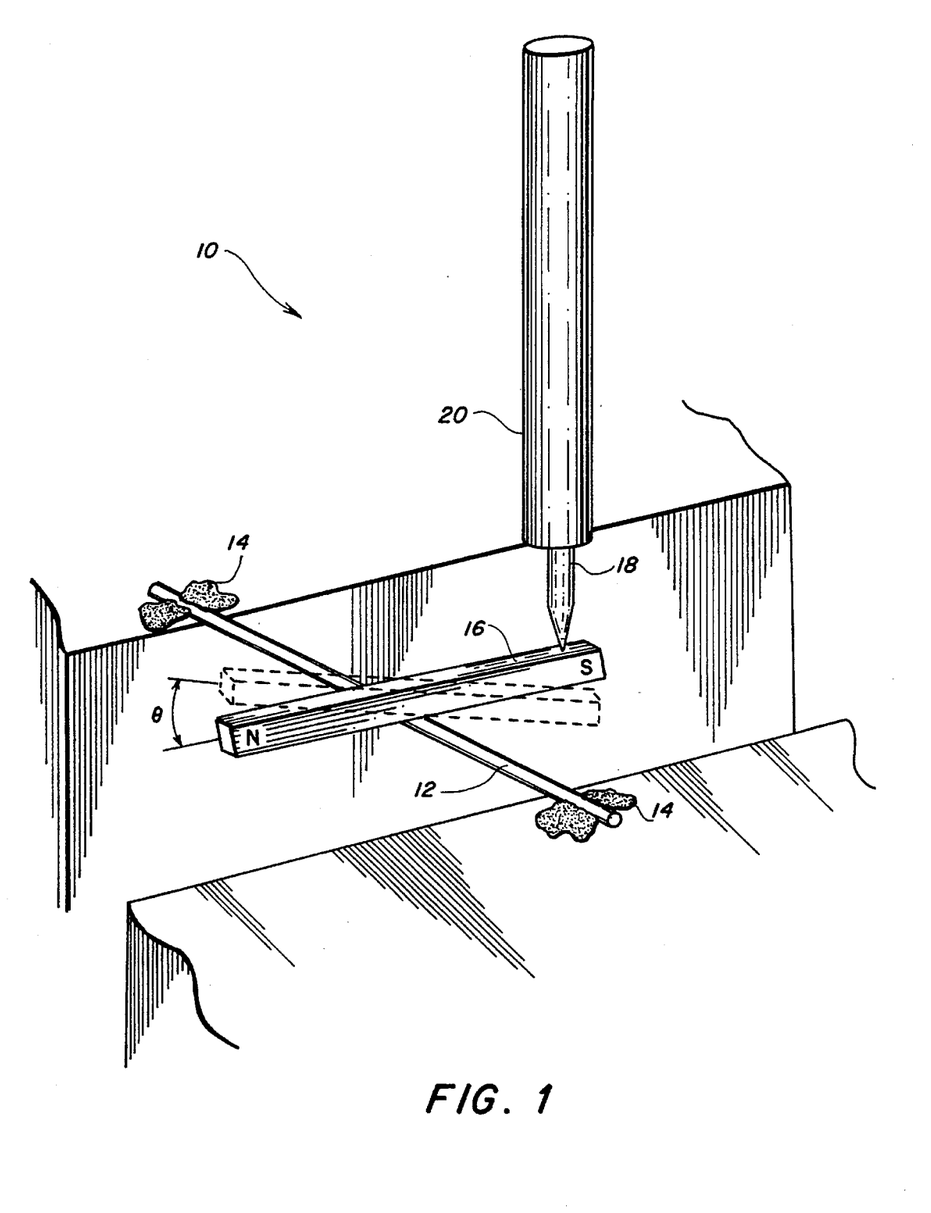
FIG. 1 is a schematic illustration of an embodiment of an electron tunneling magnetic field sensor of this invention.

FIG. 1 schematically illustrates an embodiment of the magnetic field sensor 10 of this invention. Torsion wire 12 is pulled taut and is rigidly mounted on a base by means of a nonconducting cement 14. The torsion wire must be very taut so that the only movement that the magnet can readily make is rotation about the long axis of the wire. The base to which the torsion wire is secured is electrically nonconducting and can be a block of ceramic. Bar magnet 16 is secured to torsion wire 12 by means of a conducting cement so that the torsion wire can be used to carry the tunnel current. The magnet typically has a sputtered coating of a conducting metal to improve the electrical condutivity of its surface. Tunneling tip 18, attached to a piezoelectric displacement actuator 20, is positioned over one end of the magnet 16 and is spaced thereover creating a minute gap between the tunneling tip and the magnet, typically on the order of 1 nm, to establish a tunneling current. A feedback circuit, an example of which is shown in FIG. 2, is provided for measuring current in the gap between the tunneling tip and the magnet and for providing a control voltage for the piezoelectric displacement actuator that adjusts the width of the gap to a constant value in order to maintain a constant tunneling current in the gap.

Figure 2:
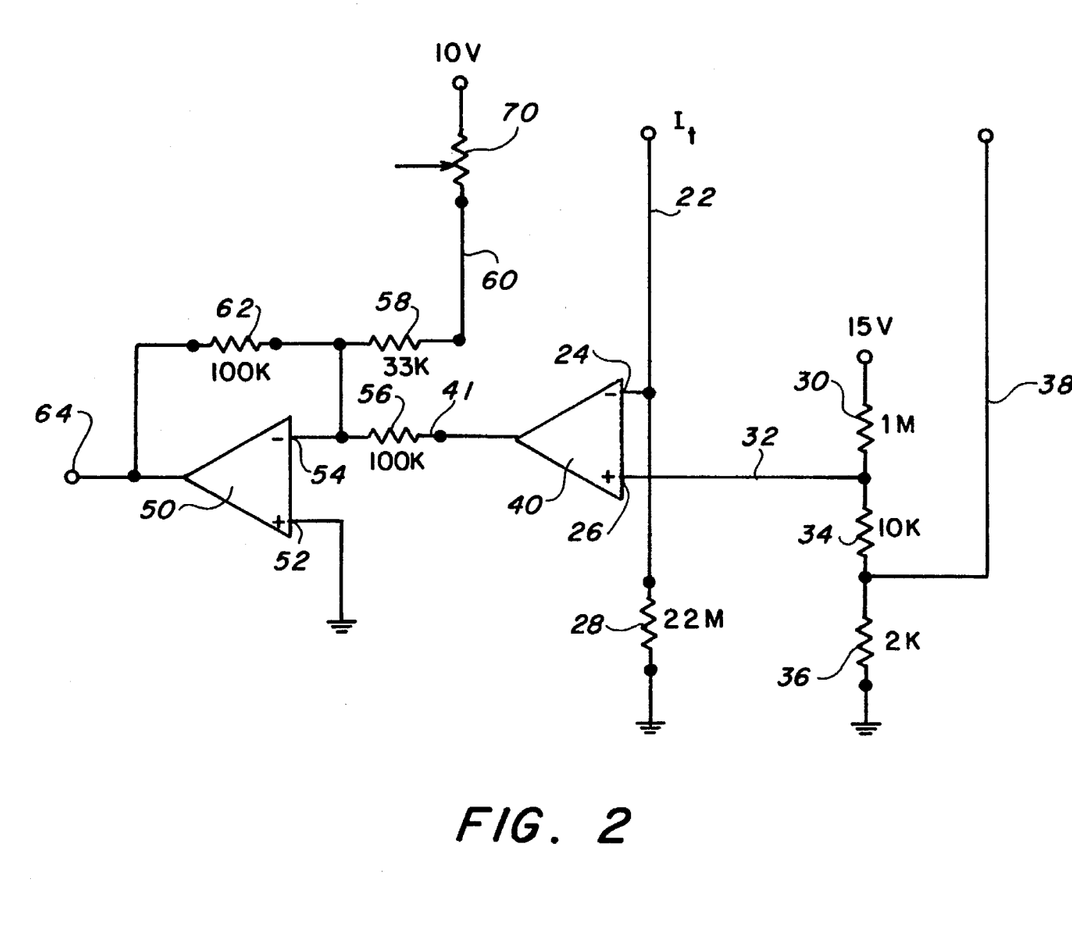
FIG. 2 is an illustration of a feedback circuit for the embodiment of the magnetic sensor shown in FIG. 1.

Referring now to the feedback control circuit shown in FIG. 2, the feedback control circuit is used to monitor the tunnel current via connection 22 between tunneling tip 18 and magnet 16 and to provide a voltage that controls the length of the piezoelectric displacement actuator 20. Connection or line 22 is connected to the torsion wire 12. The voltage source 38, connected to the tip 18, is provided to impress a biasing voltage between magnet 16 and the tip 18. The feedback control circuit also establishes and maintains a constant tunneling current by providing a deflection voltage 64, connected to the actuator 20 that controls the width of the tunneling gap. When the local magnetic field changes, the magnet 16 rotates around the torsion wire 12 and as a result, the tunnel current increases or decreases. The change in tunnel current is sensed by the feedback circuit and a deflection voltage 64 is generated at the piezoelectric displacement actuator to move the tip 18 so that the predetermined tunnel current is re-established. The deflection voltage 64 from the feedback circuit reflects changes in the magnetic field and can be used as a record of the field changes.

The circuit uses two operational amplifiers (op amps). Op amp 40 has a very high input impedance since it does not draw current. The tunnel junction in series with the 22 MΩ resistor 28 form a voltage divider. The tunnel junction typically has a resistance of 100 MΩ.

The 1 MΩ resistor 30, 10 KΩ resistor 34 and 2 KΩ resistor 36 form a voltage divider that provides the bias voltage through connection 38 and the voltage reference that determines the tunnel current through connection 32. The tunneling bias voltage is applied to the tunneling tip 18. The bias is 0.178 V, for the circuit shown but can be in the range from −2 to 2 volts.

The voltage 24 at the negative input of the op amp 40 is compared to a reference voltage at 26 (0.0297 V for the circuit shown) and if the voltages are unequal, the output 41 of the op amp 40 changes until the two inputs 24 and 26 are equalized. When the inputs 24 and 26 are equal, the tunnel current is 1.35 nA, for the circuit shown.

Op amp 50 sums the output 41 of op amp 40 with an approach control voltage. Op amp 50 is configured as an inverting amplifier where the positive input 52 is ground and the negative input 54 is the signal to be inverted. The values of resistors 56 (100 KΩ), 58 (33 KΩ) and 62 (100 KΩ) are selected so that if the approach control voltage is at its maximum, the piezoelectric displacement actuator is at its shortest length. Variable resistor 70 is used to add off-set voltage to establish tunneling. Connector or wire 60 connects resistors 56 and 70. At this voltage, the feedback loop is effectively disabled. When the approach control voltage is zero, it has no effect on the circuit.

The embodiment of the magnetic field sensor of FIG. 1 can be made by securing a 50-micron gold-plated tungsten wire to opposite ends of an opening in an electrically non-conducting block. A bar magnet is then attached to the wire with an electrically conducting epoxy cement so the magnet appears in the opening in the block. As noted above, the wire must be taut. The assembly of the magnet on the wire with the wire secured to a block is then mounted on a tunneling microscope so that the tunneling tip is near the end of the magnet. The block holding the magnet assembly is oriented so that the direction that the tunneling tip can move is optimized for detecting the rotation of the magnet. Typically, this direction is perpendicular to the torsion wire. This feedback control circuit is designed to maintain a pre-set constant tunnel current and accomplishes this by adjusting the tunneling gap with a piezoelectric displacement actuator to which the tunneling tip is attached. An oscilloscope or other voltage recording instrument can be used to record the magnitude of the control voltage and, therefore, the magnetic field changes.

Figure 3A:
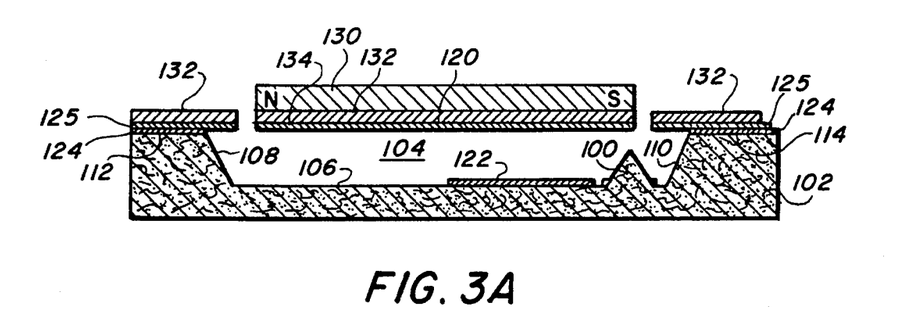
FIG. 3A is a cross-sectional view of another embodiment of an electron tunneling magnetic sensor of this invention that can be micromachined from silicon.
Figure 3B:
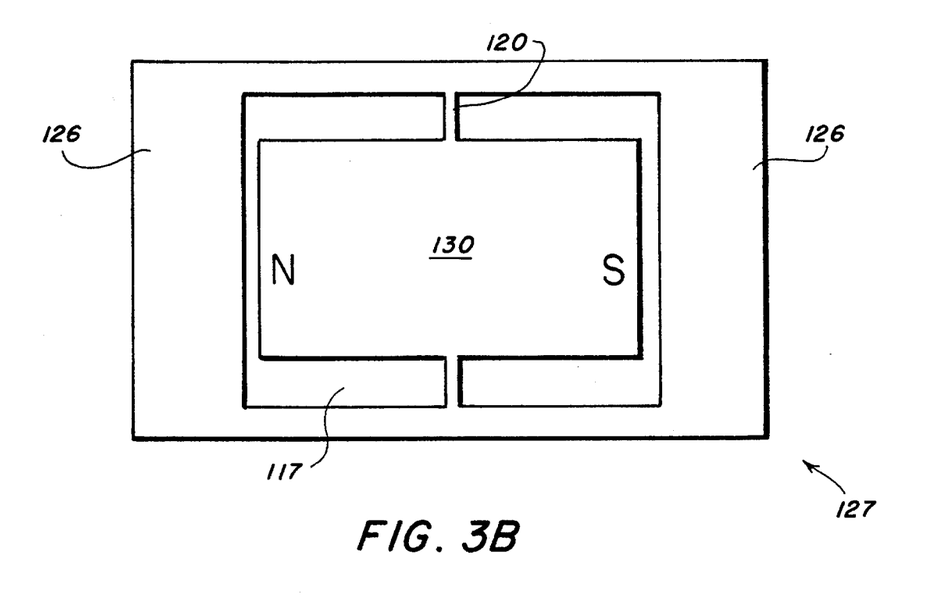
FIG. 3B is a top view of the embodiment of FIG. 3A.

FIGS. 3A and 3B illustrate another embodiment of the electron tunneling magnetic field sensor of this invention that can be micromachined from silicon. The term "micromachined from silicon" means that the main structures of the sensor can be made from silicon either by using bulk silicon micromachining, such as wet and dry chemical etching, or by using surface micromachining techniques.

Figure 5:
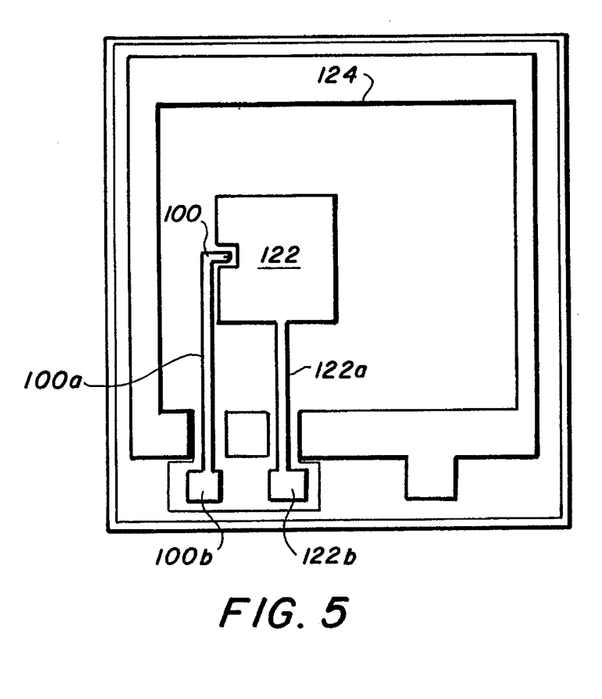
FIG. 5 is a top view of the lower portion of the sensor of FIGS. 3A and 3B showing a gold electrode on a silicon structure.
Figure 6:
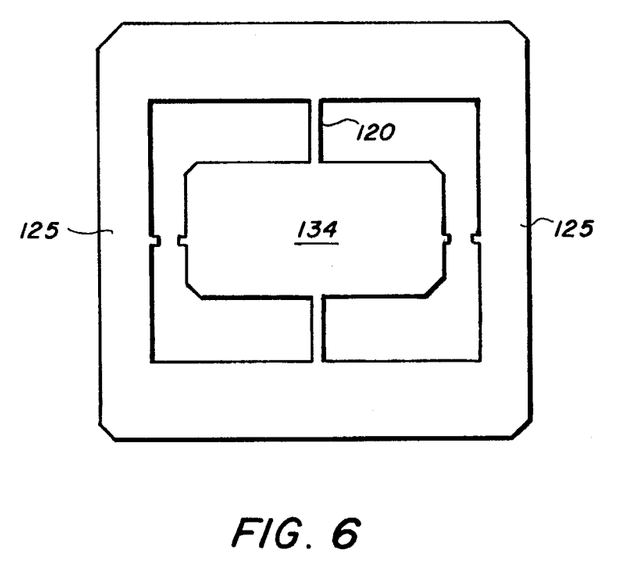
FIG. 6 is the underside of the upper portion of the sensor of FIGS. 3A and 3B showing a gold-plated electrode and the magnet on a silicon structure.

The embodiment of the sensor shown in FIGS. 3A and 3B is made from two silicon wafers or structures—one wafer is used to make the lower sensor structure shown in FIG. 5 whereas the second wafer is used to make the upper structure shown in FIG. 6. FIG. 5 is the top view of the lower structure whereas FIG. 6 is the top view of the upper structure turned to show the underside thereof. The two structures shown in FIGS. 5 and 6 are made by using chemical and dry etches and gold vapor deposition in selected regions in conjunction with masking.

As shown in FIGS. 3A, 3B and 5, tunneling tip 100 is made of silicon. The tunneling tip is integral with silicon structure 102. The silicon structure 102 is a rectangle when viewed from above and contains central open cavity 104 with a planar bottom surface 106 extending into the silicon structure and inner end wall 108 at the left extremity of the cavity and end wall 110 at the right extremity of the cavity. The end walls 108, 110 rise from the horizontal bottom surface 106 of the cavity 104 at an outwardly inclined angle to meet respective upper horizontal surfaces 112, 114. The tunneling tip 100 is generally located to the right of electrode 122 and along side of it and is coated with an electrically conducting metal to let it conduct tunneling current when the width of the gap between the tip and the magnet is appropriate.

The open cavity 104 is typically a rectangular, central depression in the silicon structure 102 formed by bottom surface 106, end walls 108, 110 and side walls (not shown). The open cavity can be of any other suitable shape. Electrode 122, in the form of a thin electrically conducting layer of an electrode material, is provided adjacent but spaced from the tunneling tip 100 on the planar bottom surface 106 of the cavity 104. Electrode 122 is spaced from the tunneling tip 100, as shown in FIGS. 3A, 3B and 5, and extends about midway along the bottom surface 106 of the structure 102 to the left. Electrode 122 is connected to a point 122b on the silicon structure 102 located outside peripheral coating 124 by means of connection 122a and tunneling tip 100 is connected to a point 100b on the silicon structure 102 also located outside peripheral coating 124 by means of connection 100a. Coating 124 is higher than surfaces 122, 122a, 122b, 100, 100a and 100b.

As shown in FIGS. 3A and 5, the lower structure 102 is provided with a peripheral coating 124 on surfaces 112,114 with a break therein for connections to electrode 122 and tip 100. Coating 124 extends around periphery of the lower structure 102, as is more clearly shown in FIG. 5, and extends inwardly from the edges of the lower structure.

The upper structure 127, as shown in FIG. 3B, is a structure, typically rectangular, with a central open space 117 within which is positioned torsion bar 120 typically extending transversely across the open space 117. Permanent magnet 130 is typically disposed centrally on the torsion bar 120 in the open space 117. Electrically conducting layer 132 is disposed over layer 125 and between magnet 130 and layer 125, as is more clearly illustrated in FIG. 3A. The relationship of the upper structure, the torsion bar and the magnet is more clearly illustrated in FIG. 3B. As shown in FIG. 6, one side of the upper structure, including the torsion bar, is typically provided with a coating of a conducting metal to form electrode 134. Electrode 134, which can be a gold layer, is in electrical contact with layer 125. The magnet 130 is either a bar magnet that is attached to structure 132, as shown in FIG. 3A, or it can be a deposited magnetic layer on structure 132.

Torsion bar 120 is a silicon strip that extends between side walls of the upper structure and is typically integral therewith. The torsion bar 120 is typically a trapezoid in cross-section that serves the purpose of the torsion wire 12 in the embodiment of FIG. 1. The torsion bar 120 is stiff enough so that when the electrostatic force is applied, only rotation about the bar occurs. If the bar is too soft, then there will also be some undesired translation of the magnet assembly toward the deflection control electrode.

Magnet 130 is cemented onto structure 132 so that its north-south pole direction is aligned perpendicular to the axis of the torsion bar and parallel to the plane of the structure shown in FIG. 6. The magnet assembly is located above cavity 104 and is not supported by or in physical contact with anything other than the torsion bar 120. Although the cross-sectional view of the sensor shown in FIG. 3A shows the tunneling tip below and spaced from one end of the magnet 130, the ends of the magnet can be reversed with compensation being made in the feedback circuit.

The device or the sensor shown in FIGS. 3A and 3B is assembled by flipping the part shown in FIG. 6 over the part shown in FIG. 5 so that one end of the magnet is positioned over the tip 100. In addition, the coating 125 makes electrical contact with the coating 124 of FIG. 5. Once the device is assembled, the electrode 122, the tip 100, the tip lead 100a, the tunnel current contact pad 100b, the connector 122a, and the rotation control contact pad 122b are not in electrical contact with any part of the piece shown in FIG. 6.

Figure 4:
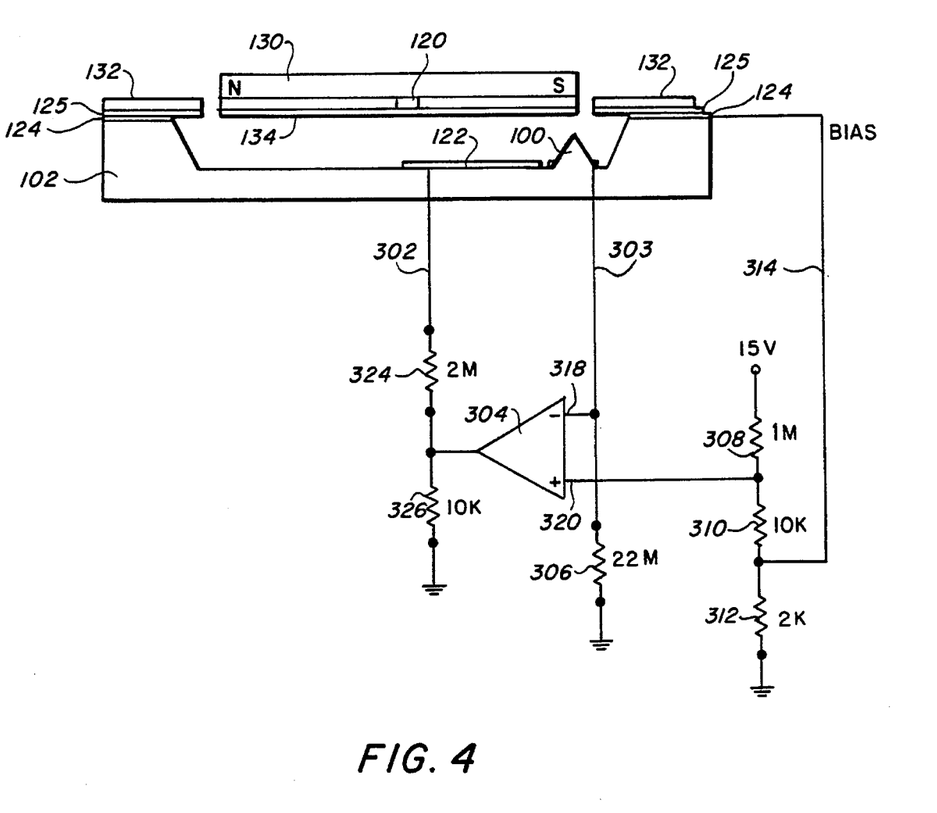
FIG. 4 is an illustration of a feedback circuit for the embodiment of the magnetic sensor shown in FIGS. 3A and 3B.

Referring now to the feedback control circuit shown in FIG. 4, voltage source 314 is provided to impress a biasing voltage between electrode 134 and the tip 100. The feedback control circuit is also used to monitor the tunnel current on connection 303 between tip 100 and electrode 134 and to provide a voltage that generates the torque that controls the distance between tip 100 and electrode 134. For this circuit, an attractive electrostatic torque is generated between electrodes 122 and 134 when a voltage is applied to electrode 122 that is different from the voltage at electrode 134. For this circuit, the voltage at electrode 134 is constant so the voltage at electrode 122 determines the torque generated. The feedback control circuit establishes and maintains a constant tunneling current by providing a deflection voltage 302 to electrode 122 that controls the width of the tunneling gap. When the local magnetic field changes, the magnet assembly rotates around torsion bar 120 and as a result, the tunneling current increases or decreases. The change in tunneling current is sensed by the feedback circuit and a deflection voltage 302 is generated at electrode 134 to move the magnet assembly so that the predetermined tunneling current is re-established. The speed of operation for the electronics is much faster than the speed at which the magnet can rotate. As a result, the magnet assembly never rotates very far from its equilibrium position since the voltage applied by the feedback control circuit generates a torque that compensates for the change in magnetic torque. The deflection voltage 302 from the feedback circuit reflects changes in the magnetic field and can be used as a record of the field changes.

The circuit uses a single operational amplifier (op amp) 304. Op amp 304 has a very high input impedance since it draws no current. The tunneling junction (tunneling gap) in series with the 22 MΩ resistor 306 form a voltage divider. The tunneling junction typically has a resistance of 100 MΩ.

The 1 MΩ resistor 308, 10 KΩ resistor 310 and 2 KΩ resistor 312 form a voltage divider that provides the bias voltage through connection 314, and the voltage reference that determines the tunnel current through connection 316. The tunneling bias voltage is applied to the tunneling counter electrode 134. The bias is 0.178 V, for the circuit shown.

The voltage at the negative input 318 of the op amp 304 is compared to a reference voltage at 320 (0.0297 V for the circuit shown) and if the voltages are unequal, the output 322 of the op amp 304 changes until the two inputs 318 and 320 are equalized. When the inputs 318 and 320 are equal, the tunnel current is 1.35 nA, for the circuit shown. Resistors 324 (2 MΩ) and 326 (10 KΩ) are required for proper operation of the op amp 304.

The method for use of the embodiment shown in FIG. 1 is as follows. The tunneling tip must first be moved to within a micron (μm) of one end of the magnet. This is necessary because the range of the piezoelectric displacement actuator is only a few μm. The coarse approach of the tip to the magnet is done with a second displacement actuator (not shown). The coarse approach displacement actuator has a range of tens of μm. The coarse approach actuator may be another piezoelectric actuator or a mechanical actuator such as a stepping motor with appropriate gearing. The coarse approach is accomplished by moving the tip and the magnet assembly toward each other in a series of steps. The step size is about one half the range of the tip piezoelectric displacement actuator range. Before each step, the tip actuator is contracted to its minimum length by applying the appropriate voltage (60 in FIG. 2) to the tip actuator. The gap between the tip and the magnet is then reduced by about one half the range of the tip displacement actuator. Next, the voltage that has been applied to the tip displacement actuator is reduced to a value of zero over a period of about 20 seconds. If the gap between the tip and the magnet reached the appropriate size for tunneling during this process, the feedback circuit will hold the gap at the tunneling distance. If tunneling is established, the coarse approach is ended and the sensor is in operation. If the sensor is not tunneling after the first approach the coarse approach sequence is repeated until tunneling is established. Once tunneling is established, the feedback error signal is a record of the magnetic field changes.

The method of use for the embodiment shown in FIGS. 3A and 3B is as follows. Before the circuit is powered, the gap between the tunneling tip and the tunneling counter electrode is much greater than is required for tunneling. When the circuit is powered, the tunneling current is much lower than required and, as a result, a voltage is generated by the feedback control circuit and is applied to the deflection control electrode. This voltage difference between the control electrodes results in a force that causes the magnet assembly to rotate about the torsion beam toward the tip. The rotation continues until the tunneling gap is small enough to give the desired tunneling current. After the desired tunneling current has been established there will be no change in the deflection voltage unless the local magnetic field changes. If the local magnetic field changes, the balance in torques will be modified and the magnet assembly will start to move. The embodiment of FIGS. 3A and 3B has the advantage that a coarse approach mechanism is not needed.

There is another method for using the embodiment shown in FIGS. 3A and 3B. The torsional resonant frequency of the suspended magnet assembly depends on the magnitude and direction of the local magnetic field and it is possible to operate this magnetic sensor so that it exploits this relationship. The magnet suspended on the torsion bar is a torsional oscillator. For the torsion balance magnetic field sensor in this mode, the oscillator is driven at its resonant frequency by applying a signal of appropriate magnitude to the control electrode. At resonance, the phase shift between the driving signal and the oscillator response is 90 degrees. A phase-locked-loop can be used to generate the signal to keep the oscillator in resonance. The error signal of the phase-locked-loop is proportional to the magnitude of the correction needed to maintain resonance and is, therefore, a measure of the changing magnetic field.

The method for sensing a change in the torsional oscillation frequency of the oscillator consisting of a magnet and a torsional structure includes the steps of electrically biasing the tunneling junction, maintaining the tip and the magnet sufficiently close to each other to establish a tunneling current therebetween, forcing the torsional oscillator to ocilate at its resonant frequency and exposing the sensor to a change in magnetic field whereby the change in magnetic field causes the oscillation frequency of the torsional oscillator to change.

The two embodiments of the electron tunneling magnetic field sensor described in FIGS. 1, 3A and 3B, operate somewhat differently. Both embodiments have a tunneling junction, a feedback control circuit, a displacement actuator and a magnet mounted on a torsion wire or bar that can rotate in response to a change in the local magnetic field. The mode of detection for the embodiment of FIG. 1 depends on the balancing of two torques, one magnetic and the other mechanical. The mode of detection for the embodiment of FIGS. 3A and 3B depends on the balancing of three torques, one magnetic, one mechanical and the third electrostatic. For the embodiment of FIG. 1, the tunneling tip is mounted on the displacement actuator and, if the magnet rotates, the tunneling current changes and the tip is moved until the desired tunneling current is re-established. For the embodiment of FIGS. 3A and 3B, the tip is stationary and the electrostatic displacement actuator is used to rotate the magnet into the proper position for tunneling. For the embodiment of FIG. 1, which is a tracking device, both the tip and the magnet move. For the embodiment of FIGS. 3A and 3B only the magnet assembly moves. The electrostatic torque that is generated by the feedback control circuit forces the magnet assembly to remain within tunneling distance of the stationary tip. For both embodiments, the voltage that is applied to the displacement actuator is a record of magnetic field changes.

The embodiment of FIG. 1 can also be micromachined but would be more complex since two moving elements would have to be incorporated into the structure.

For many applications, it may be necessary to modify the sensor to reduce vibrations and thermal drift. The major cause of thermal drift is that the components of the sensor can have different thermal expansion coefficients. The thermal drift is minimized if the device is micromachined from a single material such as silicon. Micromachining also helps to raise the mechanical vibrational frequencies because the device can be less massive and potentially more rigid.

The invention having been generally described, the following examples are given as particular embodiments of the invention to demonstrate the practice and advantages thereof. It is understood that the examples are given by way of illustration and are not intended to limit in any manner the specification or the claims that follow.

EXAMPLE 1

This example describes the silicon micromachined electron tunneling magnetic field sensor illustrated in FIGS. 3A and 3B.

The silicon structure 102 was square measuring 2.0 cm by 2.0 cm with a thickness of 400 μm. Cavity 104 was also square and centrally located within the silicon structure. End walls 108, 110, bottom surface 106, and the side walls defined cavity 104 which was open at the top. The cavity 104 measured 1.5 cm by 1.5 cm and its depth was 60 μm. At the right side on the bottom surface 106 of cavity 104, as shown in the cross-sectional view of FIG. 3A and in FIG. 5, was electrode 122 which was a sputtered gold layer that was 0.2 μm thick by 4 mm by 4 mm. On the bottom surface 106 and spaced horizontally to the right from the electrode 122 was the tunneling tip 100 located about midway between the side walls, as shown in FIGS. 3A and 5. The silicon tunneling tip was in the form of a four-sided pyramid 45 μm above the bottom surface 106 with a rectangular base of 100 μm×100 μm. The tunneling tip also had a gold layer thereover to facilitate electrical conductivity between the tunneling tip 100 and electrode 134. The torsion bar 120 was disposed at the upper portion of the side walls and its trapezoidal cross-section was 125 μm thick by 250 μm by 125 μm.

The silicon structure 127 was 125 microns thick with a 0.2 μm gold coating 125 on its bottom surface, as shown in FIG. 3A. The magnet made of neodymium-iron-boron alloy was rectangular 8 mm long, 4 mm wide and 500 μm thick. The magnet was mounted centrally in the open space 117 of the upper silicon structure and was centrally located above the open cavity 104, sufficiently apart from the end and side walls to have space around it.

EXAMPLE 2

This example describes operation of the device illustrated in FIGS. 3A and 3B.

With the parameters of the sensor given in Example 1, above, the gap width between the tunneling tip 100 and the electrode was about 20 μm, with the device being in a non-operating condition. In operating condition, the biasing voltage was 0.175 volt between electrodes 134 and 122 and the gap width at constant current of 1 nanoampere was about 1 nm.

With a change in the magnetic field surrounding the device, the magnet experienced a change in magnetic torque. The change in magnetic torque was compensated by a balancing change in the electrostatic torque so that the tunneling current and tunneling gap remained constant. The change in the tunnel current was detected by the feedback control circuit of FIG. 4 which also controled the electrostatic torque in order to maintain a constant tunneling current. The voltage needed to generate the balancing electrostatic torque was a measure of the change in the magnetic field. Up to about 100 volts from the feedback circuit was necessary to rotate the magnet assembly so that it was close enough to the tip to get the predetermined tunneling current.

Many modifications and variations of the present invention are possible in light of the above teachings. It is, therefore, to be understood that within the scope of the appended claims, the invention may be practiced otherwise than as specifically described herein.

What is claimed is:

1. An electron tunneling magnetic device for sensing rotation of a magnet due to a change in the surrounding magnetic field comprising:

a magnet mounted on a support for rotation thereabout;

a tunneling tip electrically biased with respect to and being in close proximity to said magnet creating a gap between said tip and said magnet such that a measurable tunneling current is established; and means for maintaining an essentially constant tunneling current between said tip and said magnet.

2. The device of claim 1 wherein said means is a feedback control circuit connected to said tip to adjust width of said gap to produce essentially a constant current between said tip and said magnet.

3. The device of claim 2 wherein width of said gap is in the range of about 0.5 to 2 nanometers when the device is in operating condition.

4. The device of claim 3 wherein said magnet is made of a non-magnetostrictive ferromagnetic material.

5. The device of claim 4 including an electrode in the form of a layer of gold on said magnet, said tip having the capability of conducting electrical current and is spaced with respect to said gold electrode on said magnet.

6. The device of claim 5 comprising two silicon wafers attached to each other, wherein said magnet is a permanent magnet.

7. A device for detecting rotation of a magnet that is caused by a change in the surrounding magnetic field comprising a first silicon structure and a second silicon structure disposed directly above and in contact with said first silicon structure, an electrode on said second silicon structure, an electrode on said first silicon structure spaced from said electrode on said second structure, an electron tunneling tip disposed adjacent but spaced from said electrode on said first silicon structure and directly below but spaced from said electrode on said second silicon structure so as to define a tunneling gap between said tip and said electrode on said second silicon structure, a magnet mounted for rotation around a support disposed over said second silicon structure spaced from said tip, and biasing means for biasing said gap in order to establish and maintain a constant tunneling current between said tip and said magnet.

8. The device of claim 7 wherein said tip is made of silicon and is integral with said first silicon structure.

9. The device of claim 8 which is silicon micromachinable either by bulk or surface micromachining techniques.

10. The device of claim 9 including an open cavity in said first silicon structure, said electrode on said first silicon structure and said tip are disposed in said cavity.

11. The device of claim 10 wherein said biasing means includes a feedback circuit which compares the tunnel current to a reference value and generates a signal which is used to control the position of said tip relative to said magnet.

12. A method for sensing rotation of a magnet by a magnetic field sensor caused by a change in the surrounding magnetic field comprising the steps of:

(a) electrically biasing a tunneling tip and a rotatable magnet;

(b) maintaining the tip and the magnet sufficiently close to each other to establish a tunneling current therebetween;

(c) exposing the sensor to a change in magnetic field whereby the change in magnetic field causes the magnet to rotate; and (d) directing the tunneling current to a feedback circuit which adjusts distance between the tip and the magnet in order to maintain a constant tunneling current.

13. The method of claim 12 wherein said step of electrically biasing is accomplished by impressing a voltage of about −2 to 2 volts between the magnet and the tip.

14. The method of claim 13 wherein the distance between the tip and the magnet is the approximate range of 0.5 to 2 nm.

15. The method of claim 14 including the step of silicon micromachinning the magnetic field sensor.

16. The method of claim 15 wherein tunneling current increases exponetially with decreases in the width of the tunneling gap, the tunneling current is about 1 nanoampere and the bias voltage is less than 0.5 volt.

17. A method for sensing a change in the torsional oscillation frequency of the oscillator consisting of a rotatable magnet mounted on a torsional structure with a tunneling tip spaced therefrom comprising the steps of:

(a) electrically biasing the tip and the magnet;

(b) maintaining the tip and the magnet sufficiently close to each other to establish a tunneling current therebetween;

(c) forcing the torsional oscillator to oscillate at its resonant frequency; and (d) exposing the sensor to a change in magnetic field whereby the change in magnetic field causes the oscillation frequency of the torsional oscillator to change.

18. The method of claim 17 including the step of maintaining the torsional oscillation frequency at its resonant value by means of a phase-locked-loop.

19. The method of claim 17 including the step of adjusting the torsional oscillation frequency of the torsional oscillator to its resonant oscillation frequency.

* * * * *